(12) United States Patent
Bell et al.

(10) Patent No.: US 7,068,098 B1
(45) Date of Patent: Jun. 27, 2006

(54) SLEW RATE ENHANCEMENT CIRCUIT

(75) Inventors: Marshall J Bell, Chandler, AZ (US); James Richard Kozisek, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 235 days.

(21) Appl. No.: 10/303,570

(22) Filed: Nov. 25, 2002

(51) Int. Cl.
*H03F 1/36* (2006.01)

(52) U.S. Cl. .......................... 330/75; 330/296; 327/309
(58) Field of Classification Search ................ 327/309, 327/313, 310; 330/75, 296, 298; 345/99
See application file for complete search history.

(56) References Cited

U.S. PATENT DOCUMENTS

| | | | | |
|---|---|---|---|---|
| 4,320,347 | A | | 3/1982 | Haque ............................. 330/9 |
| 4,500,846 | A | | 2/1985 | Lewyn et al. ................ 330/253 |
| 5,343,164 | A | | 8/1994 | Holmdahl ..................... 330/253 |
| 5,416,442 | A | | 5/1995 | Hobrecht ...................... 330/291 |
| 5,471,171 | A | | 11/1995 | Itakura et al. ............... 330/253 |
| 5,515,003 | A | | 5/1996 | Kimura ......................... 330/253 |
| 5,825,250 | A | | 10/1998 | Tomasini et al. ............ 330/292 |
| 5,856,760 | A | * | 1/1999 | Lam et al. .................... 330/298 |
| 6,084,475 | A | | 7/2000 | Rincon-Mora .............. 330/255 |
| 6,278,326 | B1 | | 8/2001 | Murray et al. ............... 330/288 |
| 6,333,674 | B1 | | 12/2001 | Dao .............................. 330/86 |
| 6,392,485 | B1 | | 5/2002 | Doi et al. .................... 330/253 |
| 6,456,161 | B1 | | 9/2002 | Smith .......................... 330/252 |
| 6,507,231 | B1 | * | 1/2003 | Hecht et al. ................. 327/321 |
| 6,639,470 | B1 | * | 10/2003 | Andrys et al. ............... 330/296 |
| 6,667,607 | B1 | * | 12/2003 | Kawamura et al. ......... 323/312 |
| 6,747,501 | B1 | * | 6/2004 | Ker et al. .................... 327/310 |
| 6,897,702 | B1 | * | 5/2005 | Khieu et al. ................. 327/313 |

* cited by examiner

*Primary Examiner*—Alexander Eisen
*Assistant Examiner*—Kimnhung Nguyen
(74) *Attorney, Agent, or Firm*—Cahill, von Hellens & Glazer, P.L.C.

(57) ABSTRACT

An operational amplifier (op-amp) (200, 800, 900) having at least a first stage and a second stage has a feedback path (825) from the output to the input of a second stage, the feedback path includes a first capacitor (801) and a second capacitor (803) in series connected at a node (815) between the first capacitor and the second capacitor, and a clamping circuit (206) connected between the node and a ground (230) for clamping a voltage at the node in response to a voltage at the output. The impedance of the clamping circuit is high during small amplitude input signals, and is low during large amplitude input signals. During large amplitude input signals, the compensation capacitance of the op-amp does not provide feedback from the output to the input, thereby increasing slew rate. A liquid crystal display panel system (1100) includes the op-amp (900) as a column driver.

11 Claims, 9 Drawing Sheets

200

OUTPUT VOLTAGE VS. TIME

300

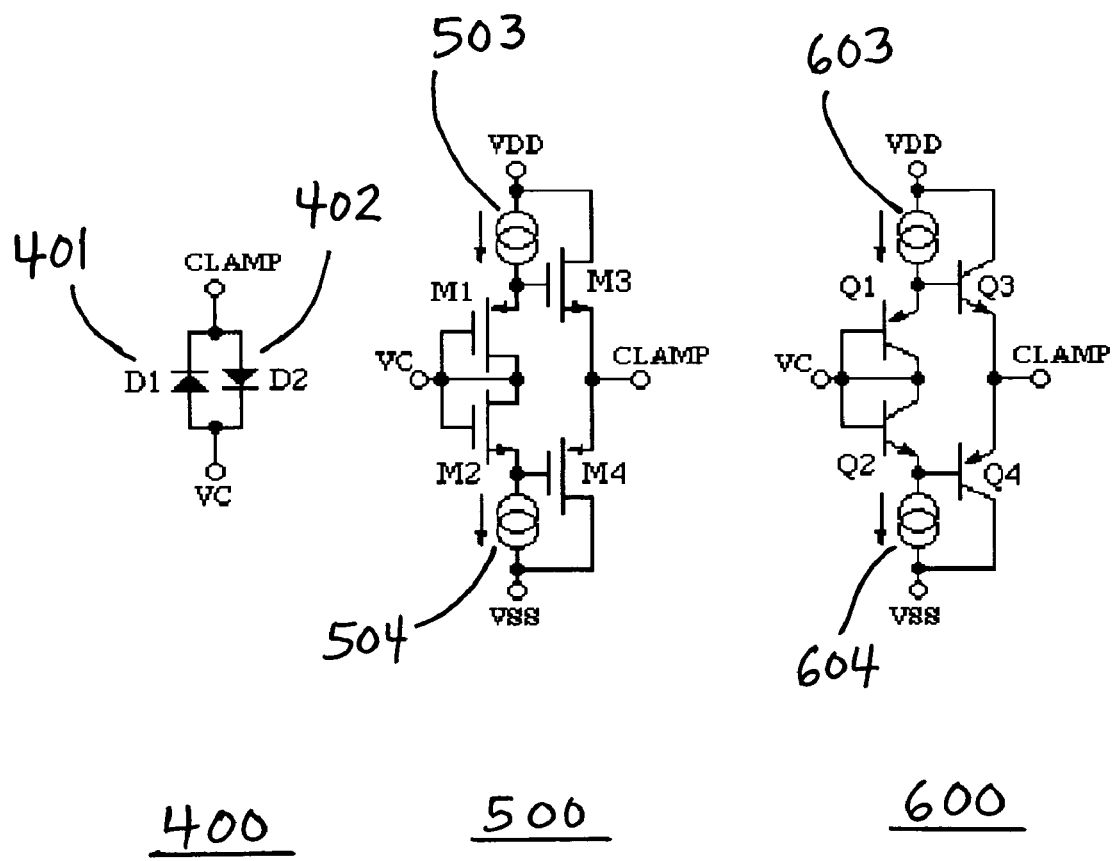

800

SLEW RATE ENHANCEMENT CIRCUIT

BACKGROUND OF THE INVENTION

1. Field of the Invention

This invention relates generally to electronic amplifiers with semiconductor amplifying devices, including a signal feedback path having negative feedback, and more particularly, a signal feedback path for increasing slew rate.

2. Description of the Related Art

An operational amplifier (op-amp) having a class "B" or "AB" buffer or output stage is well known. The equations that govern the operation of an op-amp are also well known. If the op-amp is to be made stable, the unity gain crossing frequency must be controlled. The conventional technique for controlling the unity gain crossing frequency is to couple a compensation capacitor C in a feedback path between an output and an input of the op-amp. The well known Miller capacitance reduces the gain of an amplifier by providing negative feedback between the base and collector of bipolar transistors. A compensation capacitor C is a capacitor, external to the transistor(s) of the op-amp and possibly also external to the integrated circuit of the op-amp, which acts as an additional Miller capacitance.

If more than two poles exist before the unity gain frequency $f_{UNITY}$ is reached, the op-amp is unstable as a result of a 90 degree phase shift that occurs in the feedback path due to inherent characteristics of each filter of the op-amp. More phase shifts are produced at higher frequencies. At frequencies having more than two phase shifts, a desired negative feedback becomes an undesired positive feedback, and the op-amp becomes unstable. The compensation capacitor C operates to push the first dominant pole down to a low enough frequency such that the op-amp gain falls below unity before the second pole is reached. The larger the compensation capacitor, the larger the feedback, thereby lowering the gain at all frequencies. Because the gain decreases as frequency increases, a designer wants the gain to fall to unity prior to reaching a frequency at which the feedback becomes positive. The larger the value of the compensation capacitor, the more stable is the op-amp. However, the value of the compensation capacitor C also affects the maximum slew rate. It is also desirable to have a high slew rate, which requires a small value of the compensation capacitor C. Reducing the value of the compensation capacitor C however, makes the op-amp less stable because the first dominant pole will then be moved to a higher frequency. Therefore, a high value of the compensation capacitor C, for greater stability, and a low value of the compensation capacitor C, for higher slew rate, conflict with each other.

The slew rate is defined as the maximum rate of change in output voltage, $\Delta V_O/\Delta t$, for large input signals. If a step function is applied to the input at time=$t_0$, a small signal analysis of the op-amp circuit predicts a response, $V_O$, that rises exponentially to about $V_{CC}$ at time=$t_1$. However, the actual measured response rises linearly to about $V_{CC}$ at a later time of time=$t_2$. The slower response occurs because the step function is a fast and a large signal change at the input that requires a fast and large charging and/or discharging of circuit capacitance, including the compensation capacitor C, which must be accomplished using the available bias current at a stage driving the class AB output stage. When the available bias current cannot charge/discharge circuit capacitance fast enough to give the predicted small signal analysis response, the op-amp is said to be slew rate limited by the available bias current. When the input to op-amp changes at a rate faster than the maximum slew rate, the op-amp does not respond linearly, rather the op-amp delivers as an output whatever current is available. The slew rate is expressed in volts per microsecond (V/μs).

An op-amp comprises at least a transconductance differential input stage and a voltage amplification output stage. The frequency where the open loop gain falls to unity for op-amp is:

$$f_{UNITY} = gm_1/C \qquad \text{Equation (1)}$$

where $gm_1$ is the transconductance of the input stage. For a bipolar transistor, and assuming no emitter resistors in the differential input stage, $gm_1$ is related to the tail current $I_{TAIL}$ shared by the input stage transistors, by:

$$gm_1 = I_{TAIL}/2V_T \qquad \text{Equation (2)}$$

A typical prior art two-stage op-amp 100 is shown in FIG. 1. The op-amp 100 comprises an input stage 110 and an output stage 120. The input stage 110 comprises a differential pair of transistors 101 and 102. Transistors 103 and 104 form an active load for transistors 101 and 102. The output stage 120 produces a large voltage gain. A negative feedback path 125 comprising a compensation capacitor C 106 is coupled from an output node 111 of the output stage 120 to an input node 113 of the output stage 120. The value of the compensation capacitor C 106 and amount of tail current $I_{TAIL}$ 108 are determined by the small signal characteristics of the op-amp 100, which, in turn, are chosen based upon how the op-amp is to be used. In particular, the value of the compensation capacitor C 106 is set to a large enough capacitance to make the op-amp stable at the intended operating frequency.

The slew rate is determined by the value of the compensation capacitor 106 and the amount of tail current $I_{TAIL}$ 108. The slew rate measures how fast the op-amp can charge a load capacitance $C_{LOAD}$ 115, such as a liquid crystal display (LCD) panel. Although, the slew rate may be affected by the amount of the capacitance of the load $C_{LOAD}$ 115, the load capacitance is usually fixed. For a given load, if the output stage's maximum output current $I_O$ 112 is larger than the current necessary to charge the load capacitance (which is usually the case), then the slew rate is:

$$\text{Slew Rate} = \Delta V_O/\Delta t = I_{TAIL}/C \qquad \text{Equation (3)}$$

That is, the slew rate is determined by the maximum current available in the stage driving the output stage.

It can be shown that for a MOSFET, $$gm_1 = \sqrt{\frac{I_{TAIL}}{2} \mu C_{ox} \frac{W}{L}}$$

For an op-amp comprising MOSFETs, it can also be shown that $$\text{Slew Rate} = \frac{gm_2}{C_{LOAD}} \sqrt{\frac{2 I_{TAIL}}{\mu C_{ox} \frac{W}{L}}} \qquad \text{Equation (4)}$$

where $gm_1$ is the transconductance of the input stage 110 and $gm_2$ is the transconductance of the output stage 120 of the op-amp 100 of FIG. 1. Therefore, the slew rate of the prior art MOSFET op-amp 100 could be improved by increasing the differential pair's bias current, $I_{TAIL}$. However, because $I_{TAIL}$ is under the radical in Equation (4), in order to double the slew rate, the differential pair's bias would have to be disadvantageously increased by a factor of four. Increasing the bias current $I_{TAIL}$ of the differential stage would disadvantageously increase the quiescent current of the op-amp. Moreover, increasing the bias current of the input stage of an op-amp disadvantageously increases the bandwidth of the op-amp. Furthermore, the small signal performance would become degraded because the small-signal voltage gain increases in proportion to the current $I_{TAIL}$, but $gm_1$ increases in proportional to the square root of the current $I_{TAIL}$, i.e., more slowly.

For an op-amp comprising bipolar transistors (not shown), the slew rate is completely determined by the small signal design and the op-amp's required quiescent current. In particular, $I_{TAIL}$ is also determined by the small signal design of the op-amp. For an op-amp comprising bipolar transistors, it can be shown that the slew rate is independent of $gm_1$, and that the slew rate cannot be increased by increasing $I_{TAIL}$ because increasing $I_{TAIL}$ requires a corresponding increase in C to maintain stability.

To obtain higher slew rates, designers of prior art circuits have: a) reduced the input stage transconductance $gm_1$ associated with the input stage by adding resistors in the emitter paths of the input stage transistors, and then increased $I_{TAIL}$ or decreased the value of the compensation capacitor C to achieve stability, but adding resistors to the emitter paths of the input stage transistors produces additional noise; b) decreased the value of the compensation capacitor C, but this is undesirable because this adversely affects the small signal parameters; c) increased the current available to charge the compensation capacitor C, but this is disadvantageous in battery-powered devices; or d) used cross-coupled transconductance reduction, but this increases circuit complexity. A more desirable alternative is to design the circuit for desired small signal parameters and then modify the circuit to change the slew rate under large signal conditions in a way that overcomes the disadvantages of the prior art.

Examples of known circuits related to improving slew rate, or related to driving LCD panels are: U.S. Pat. No. 4,320,347, issued Mar. 16, 1982, to Haque, entitled Switched Capacitor Comparator discloses voltage comparator that has two periods of operation, and in which a feedback capacitor is switched into the circuit during an initialization period to ensure that the op-amp is stable while in a unity gain mode, and then switched out of the circuit during a period in which the op-amp is operating as a voltage comparator. However, during the period that the voltage comparator is operating as an amplifier, the feedback capacitor is not switched in and out of the circuit; furthermore, Haque lacks a clamp to shunt the feedback capacitor to ground.

U.S. Pat. No. 4,500,846 issued, Feb. 19, 1985, to Lewyn, et al., entitled Circuit for Effecting Improved Slew Rate of Operational Amplifiers discloses an op-amp with an input stage and an output stage and two compensating capacitors connected in parallel that are switchable into and out of a feedback path, controlled by an external clock pulse train, to vary the amount of frequency compensation. However, Lewyn et al., lacks a clamp to shunt either compensation capacitor to ground. As a result, Lewyn et al., disadvantageously requires the input stage to fully charge/discharge the compensation capacitor.

U.S. Pat. No. 5,416,442 issued, May 16, 1995, to Hobrecht entitled Slew Rate Enhancement Circuit for Class A Amplifier discloses an amplifier that has one capacitor in each of two separate feedback paths and means to switch the capacitor of one of the feedback paths in and out of its feedback path. However, Hobrecht lacks a clamp to shunt any compensation capacitor to ground.

U.S. Pat. No. 5,471,171 issued, Nov. 28, 1995, to Itakura et al., entitled Amplifier Device Capable of Realizing High Slew Rate with Low Power Consumption discloses an amplifier for use in driving a LCD display. Itakura et al., uses complex circuitry to realize a high slew rate by increasing a total bias current when needed. However, Itakura et al., lacks any means of switching a compensation capacitor in or out of the circuitry.

U.S. Pat. No. 5,825,250 issued, Oct. 20, 1998, to Tomasini et al., entitled Operational Amplifier having an Adjustable Frequency Compensation discloses an op-amp have two compensation capacitors in parallel that are switched in or out of a feedback path by an external signal generated by a logic circuit, to vary the amount of frequency compensation. However, Tomasini et al., lacks a clamp to shunt any compensation capacitor to ground. As a result, Tomasini et al., disadvantageously requires the input, or transconductance, stage to fully charge/discharge the compensation capacitor(s).

U.S. Pat. No. 6,333,674, issued Dec. 25, 2001, to Dao, entitled Feedback Stabilization Apparatus and Methods discloses an audio amplifier having a parallel LC tuned circuit in which additional capacitance is switched into the LC tuned circuit, by diodes, as the voltage applied to the LC tuned circuit increases. However, the capacitance that is switched is not compensation capacitance.

U.S. Pat. No. 6,392,485 issued, May 21, 2002, to Doi, et al., entitled High Slew Rate Differential Amplifier Circuit discloses a differential amplifier with two compensating capacitors in parallel, used for driving a LCD panel. However, Doi, et al., lacks any means for switching either capacitor in or out of the circuit.

U.S. Pat. No. 6,456,161 issued, Sep. 24, 2002, to Smith, entitled Enhanced Slew Rate in Amplifier Circuits discloses an amplifier having a pair of compensation capacitors, but neither of them are switched in or out of the circuit.

Thus, what is needed is a circuit that overcomes the disadvantages of the prior art, and that increases slew rate capability without degrading other performance parameters. In particular, what is needed is an uncomplicated circuit that maintains stability at the desired frequency under small signal conditions, and increases its slew rate under large signal conditions without also increasing tail current under small signal conditions, and having a sufficiently high slew rate useful for driving a LCD display panel. These and other objects of the present invention will become apparent to those skilled in the art as the description thereof proceeds.

SUMMARY OF THE INVENTION

Briefly described, and in accordance with a preferred embodiment thereof, the present invention relates to an amplifier that has an output and an input, and that has a feedback path from the output to the input. The feedback path includes a first capacitor and a second capacitor in series connected at a node between the first capacitor and the second capacitor. The amplifier also includes a clamping circuit connected between the node and a ground that clamps the node in response to a voltage at the output.

Preferably, each of the capacitors are of substantially the same capacitance, and the clamping circuit clamps the node in response to a voltage at the output being greater than twice the voltage at the node.

Another aspect of the present invention relates to a slew rate boosted amplifier that includes a transconductance amplifier stage having at least one input and at least one output, a second amplifier stage having an output and at least one input, wherein the at least one output of the transconductance stage is coupled to the at least one input of the second stage. The slew rate boosted amplifier also includes a capacitance path electrically coupled from the output of the second stage to the input of the second stage, wherein the capacitance path includes at least two capacitors in series connected at a common node and a clamping circuit electrically coupled between the common node and a ground with respect to at least alternating current.

A further aspect of the invention relates to an amplifier that has an input for receiving input signals, an output for outputting output signals, and a feedback path from the input to the output. The feedback path includes two capacitors in series connected at a node. The amplifier also has a clamping circuit for clamping a voltage at the node in response to a voltage at the output. The impedance of the clamping circuit is high for small amplitude input signals and the impedance of the clamping circuit is small for large amplitude input signals.

Yet another aspect of the invention relates to a LCD panel that has a thin film transistor associated with a pixel. The LCD panel includes an amplifier that has an output electrically coupled to the thin film transistor, and that also has an input. The amplifier has a feedback path from the output to the input. The feedback path includes a first capacitor and a second capacitor in series connected at a node between the first capacitor and the second capacitor. The amplifier also includes a clamping circuit connected between the node and an AC ground for clamping a voltage at the node in response to a voltage at the output.

Still another aspect of the invention relates to a LCD panel system that includes a transconductance amplifier stage that has at least one input and at least one output, and a second amplifier stage that has an output and at least one input. The at least one output of the transconductance stage is coupled to the at least one input of the second stage. A capacitance path is electrically coupled from the output of the second stage to the input of the second stage, wherein the capacitance path includes at least two capacitors in series connected at a common node and a clamping circuit electrically coupled between the common node and a ground with respect to at least alternating current. The LCD panel system also includes a LCD panel electrically coupled to the output of the second amplifier.

Yet a further aspect of the invention relates to a LCD panel system that includes an amplifier having an input for receiving input signals, an output for outputting output signals, and a feedback path from the input to the output. The feedback path includes two capacitors in series connected at a node, and a clamping circuit for clamping the node in response to a voltage at the node. The output impedance for small amplitude input signals has a first value and the output impedance for large amplitude input signals has a second value, wherein the second value is less than the first value. The LCD panel system also includes a LCD panel electrically coupled to the output of the amplifier.

BRIEF DESCRIPTION OF THE DRAWINGS

The present invention will be described with greater specificity and clarity with reference to the following drawings, in which:

FIG. 4 is an example of a clamping circuit used in accordance with the invention.

FIG. 5 is another example of a clamping circuit used in accordance with the invention.

FIG. 6 is yet another example of a clamping circuit used in accordance with the invention.

DESCRIPTION OF THE PREFERRED EMBODIMENT

Figure 1:
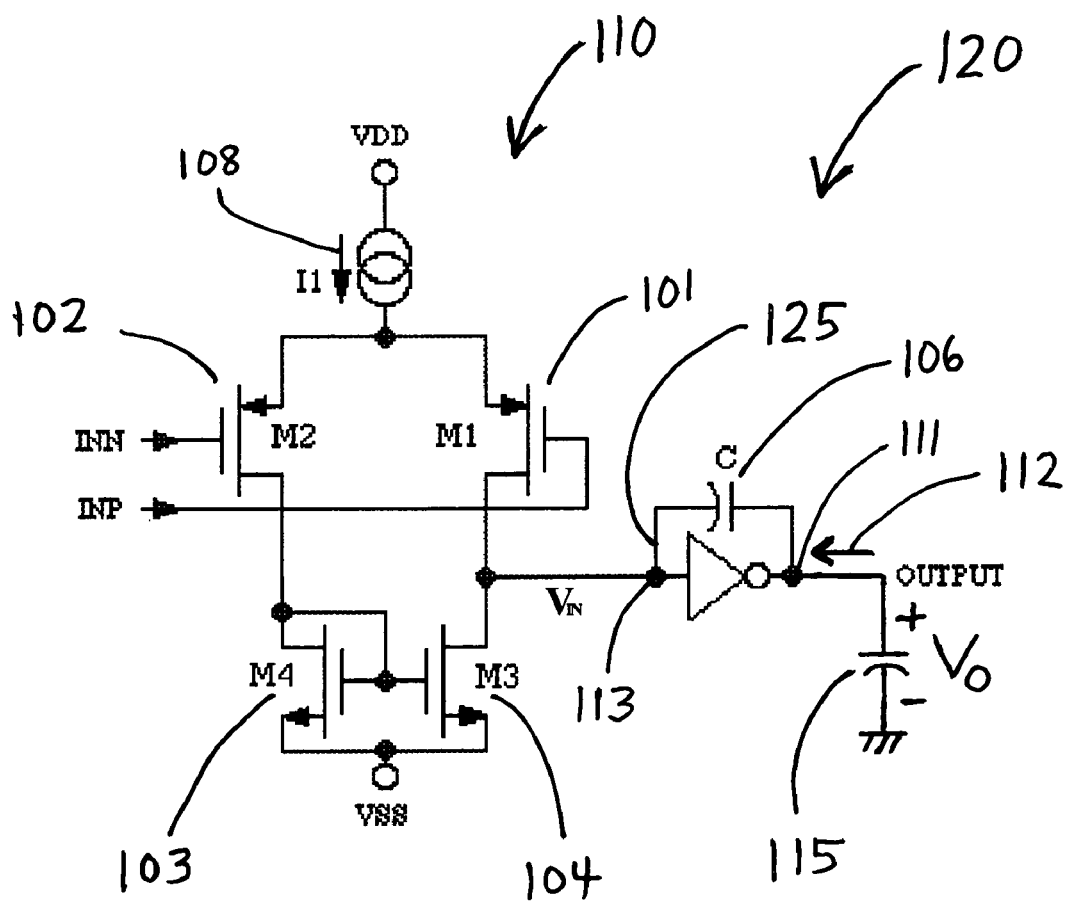
FIG. 1 is a simplified prior art two-stage op-amp.
Figure 2:
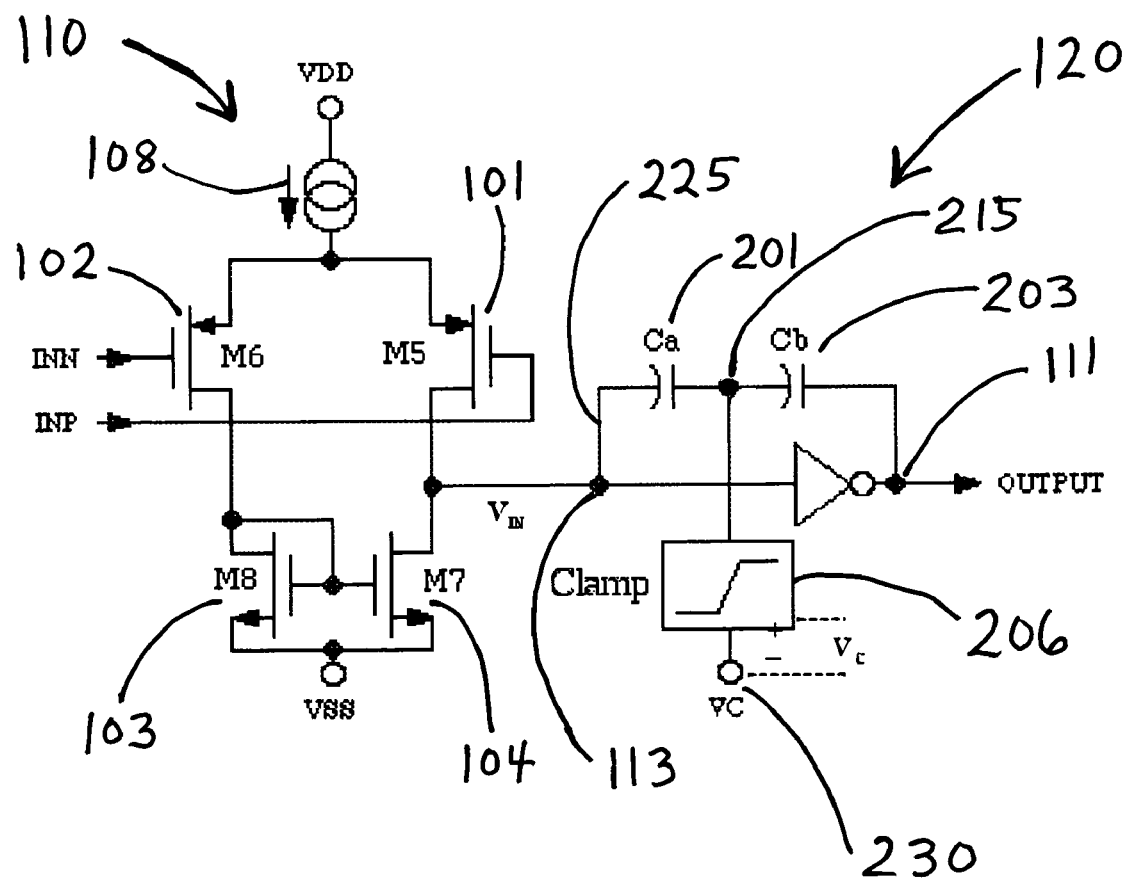
FIG. 2 is a simplified two-stage op-amp in accordance with the invention.

FIG. 2 shows a simplified two-stage op-amp 200 in accordance with the invention that has a topology that removes the dependency of the slew rate on the small signal design and on the op-amp's required quiescent current. Circuit elements common to both FIG. 1 and FIG. 2 are numbered similarly. For simplicity of illustration, $C_{LOAD}$ is not shown in FIG. 2.

In FIG. 2, the compensation capacitor C 106 of FIG. 1 is replaced by two capacitors, $C_A$ 201 and $C_B$ 203, in series, with a node AB 215 between them. The feedback path 225 in accordance with the invention comprises capacitor $C_A$ 201, capacitor $C_B$ 203 and a clamping circuit 206 connected between node AB 215 and a ground 230. To maintain the same compensation as FIG. 1, the series combination of $C_A$ and $C_B$ must equal that of C:

$$C = C_A C_B / C_A + C_B \qquad \text{Equation (5)}$$

Advantageously, the clamping circuit 206 allows the op-amp 200 to perform identically to that of the prior art op-amp of FIG. 1 if the output voltage swing is less than $2\Delta V_{CLAMP}$. Preferably, the capacitance of $C_A$ is equal to the capacitance of $C_B$ in order to maintain the individual capacitances of $C_A$ and $C_B$ as small as possible. The potential at node $V_{AB}$ 210 follows the output voltage, but at half the value (assuming capacitors $C_A$ and $C_B$ are of equal capacitance). During small signal transients, the change in output voltage, $\Delta V_O$, will appear across the series combination of the two capacitors $C_A$ and $C_B$, with the clamping circuit 206 playing no role. During small signal conditions, the current required to charge C, which is the series combination of $C_A$ and $C_B$, to $\Delta V_O$ must come equally from the output stage current $I_O$ and the input stage current $I_{TAIL}$. Therefore, $$\text{Slew Rate} = \frac{\Delta V_o}{\Delta t} = \frac{\text{Min}(I_{TAIL}, I_o)}{C} \quad \text{Equation (6)}$$

That is, the maximum slew rate is determined by the lesser of $I_{TAIL}$ and $I_O$. If the output stage's maximum output current $I_O$ is larger than the input stage's maximum current $I_{TAIL}$ (which is usually the case), then the slew rate is limited by the value of $I_{TAIL}$. For $\Delta V_O \leq 2\Delta V_{CLAMP}$, $$\text{Slew Rate} = \frac{\Delta V_o}{\Delta t} = \frac{I_{TAIL}}{\frac{C_A C_B}{C_A + C_B}} = \frac{I_{TAIL}}{C} \quad \text{Equation (7)}$$

Equation (7) represents the slew rate of the circuit of FIG. 2 under small signal conditions. A comparison of Equation (3) with Equation (7) reveals that, advantageously, the slew rate of the circuit of FIG. 2 under small signals conditions remains as high as the slew rate of the circuit of FIG. 1 under small signal conditions.

Assuming $C_A$ and $C_B$ are equal, the voltage across $C_A$ is half the voltage across a single compensation capacitor C in an otherwise similar circuit. When $\Delta V_O > 2\Delta V_{CLAMP}$, the clamping circuit 206 clamps node AB to $V_{CLAMP} \pm \Delta V_O$, and $\Delta V_O$ appears only across $C_B$. The current to charge $C_B$ comes equally from $I_O$ of the output stage 120 and $I_{CLAMP}$ of the clamping circuit 206. Therefore, for $\Delta V_O > 2\Delta V_{CLAMP}$, $$\text{Slew Rate} = \frac{\Delta V_o}{\Delta t} = \frac{\text{Min}(I_{CLAMP}, I_o)}{C_B} \quad \text{Equation (8)}$$

That is, under large signal conditions, the maximum slew rate is determined by the lesser of $I_{CLAMP}$ and $I_O$. Advantageously, $I_{CLAMP}$ and $I_O$ are independent of the small signal design of the op-amp 200. In many designs, the output stage 120 is a class B or AB stage and can provide a large amount of current during large transients while maintaining a low quiescent current. The clamping circuit 206 has similar requirements. It only needs to deliver large current under large transients. Therefore, assuming that the clamping circuit 206 can supply approximately the same amount of current $I_{CLAMP}$ as the output stage current $I_O$ (which is usually the case), the slew rate under large signal conditions is, for $\Delta V_O > 1\Delta V_{CLAMP}$, $$\text{Slew Rate} = \frac{\Delta V_o}{\Delta t} = \frac{I_{CLAMP}}{C_B} \quad \text{Equation (9)}$$

Equation (9) represents the slew rate of the circuit of FIG. 2 under large signal conditions. A comparison of Equation (3) with Equation (9) reveals that, advantageously, the slew rate of the circuit of FIG. 2 under large signals conditions is higher than the slew rate of the circuit of FIG. 1 under large signal conditions. In spite of $C_B$ having twice the capacitance of a prior art compensation capacitor C, the enhancement circuit of the invention allows the slew rate under large signal conditions to be higher than the slew rate under small signal conditions because $I_{CLAMP}$ is much more than $I_{TAIL}$.

Typically, $I_{CLAMP}$ is more than ten times greater than $I_{TAIL}$. During large amplitude input signals, the compensation capacitance of the op-amp 200 does not provide feedback from the output node 111 to the input node 113 of the output stage 120, thereby increasing slew rate.

Of course, when $\Delta V_O > 2\Delta V_{CLAMP}$, it is also true that the clamping circuit 206 clamps node AB to $V_{CLAMP} \pm \Delta V_{IN}$, and $\Delta V_{IN}$ appears only across $C_A$. The current to charge $C_A$ comes from the input stage 110 and the clamping circuit 206. For $\Delta V_O > 2\Delta V_{CLAMP}$ where $I_{IN}$ is the input current to the second stage, $$\frac{\Delta V_{IN}}{\Delta t} = \frac{\text{Min}(I_{CLAMP}, I_{IN})}{C_A} \quad \text{Equation (10)}$$

Typically, $I_{IN}$ is much less than $I_{CLAMP}$. Therefore, while not the slew rate of the op-amp, the rate that the voltage at node AB changes is nevertheless, $$\frac{\Delta V_{IN}}{\Delta t} = \frac{I_{IN}}{C_A} \quad \text{Equation (11)}$$

Figure 3:
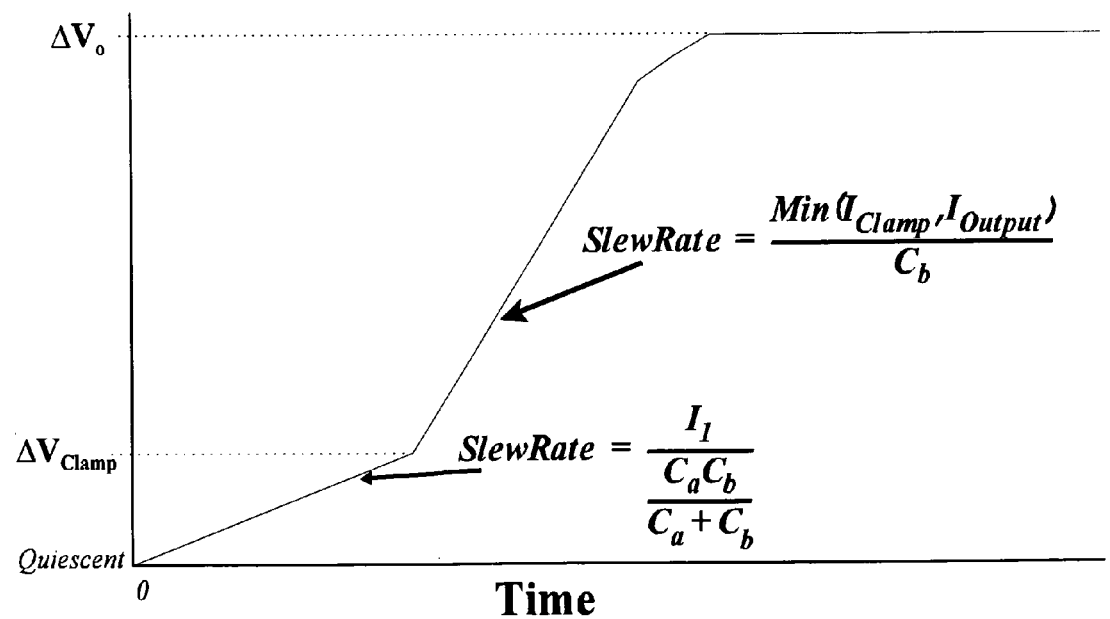
FIG. 3 is a graph showing an output in response to a step input of an op-amp in accordance with the invention.

FIG. 3 is a graph 300 of the output response of an op-amp to a step function input signal using the feedback path 225 in accordance with the invention. The total slew rate of the op-amp 200 is a combination of Equation (7) and Equation (9). To achieve the maximum overall slew rate, it is desirable to keep $\Delta V_{CLAMP}$ as small as possible. However, practical implementations, limit the minimum $\Delta V_{CLAMP}$. Preferably, the capacitors $C_A$ and $C_B$ have substantially the same capacitance, and therefore the voltage across each capacitor $C_A$ and $C_B$ is about half the voltage difference between the input node 113 and the output node 111. Therefore, at small signal levels, the voltage at node AB is maintained at a voltage of approximately half the voltage of the output $V_O$ because the series combination of $C_A$ and $C_B$ act as a voltage divider for AC signals.

FIG. 3 shows that when $V_O$ is small, i.e., when $V_O$ less than twice the voltage at node AB, the slew rate is relatively slow, and is approximately at the slew rate of a prior art circuit. However, when $V_O$ is large, i.e., when $V_O$ greater than the voltage at node AB, the slew rate advantageously changes to a higher rate. Furthermore, because $\Delta V_{CLAMP}$ is pre-selected to be relatively low in comparison with $\Delta V_O$, the total slew rate under large signal conditions is primarily determined by Equation (9).

Various versions of the clamping circuit 206 are shown in FIGS. 4, 5 and 6. FIG. 4 shows a clamping circuit 400 comprising two diodes 401 and 402 in an anti-parallel configuration. Clamping circuit 400 requires $I_{TAIL}$ to slew $C_A$ 201 at about 0.7 V, and requires $I_O$ to slew $C_B$ 203 at about −0.7 V. The diodes D1 401 and D2 402 are off under small signal conditions. A large $\Delta V_O/\Delta t$ at the output node 111 is coupled through the feedback capacitor CB 203 to the diodes 401 and 402 that divert a portion of the output current $I_O$ 112 to ground 230. For positive large output signal voltages, diode D2 402 diverts the portion of $I_O$ to ground, and for negative large output signal voltages, diode D1 401 diverts the portion of $I_O$ to ground. By ground 230, it is meant a ground to at least AC signals, but alternatively, is a ground to both AC and DC signals. The portion of the output current $I_O$ that is diverted to ground 230 by the clamping circuit depends upon the capacitance of the load $C_{LOAD}$; however, the amount of the portion is not relevant to understanding the invention. The clamp voltage, $\Delta V_{CLAMP}$, of clamping circuit 500 FIG. 5 and of clamping circuit 600 of FIG. 6 are not pre-set at a PN junction voltage of 0.7 V; but can be adjusted by the relative size of the devices and the value of the current sources. However, the relatively low tolerances of the components of the clamping circuit 206, limit the minimum $\Delta V_{CLAMP}$ to about 0.5 V for the clamping circuit 500 of FIG. 5, and to about 200 mV for the clamping circuit 600 of FIG. 6. Advantageously, the current sources 503 and 504 of the clamping circuit 500 and the current sources 603 and 604 of clamping circuit 600, add very little to the total current of the op-amp 200.

Figure 7:
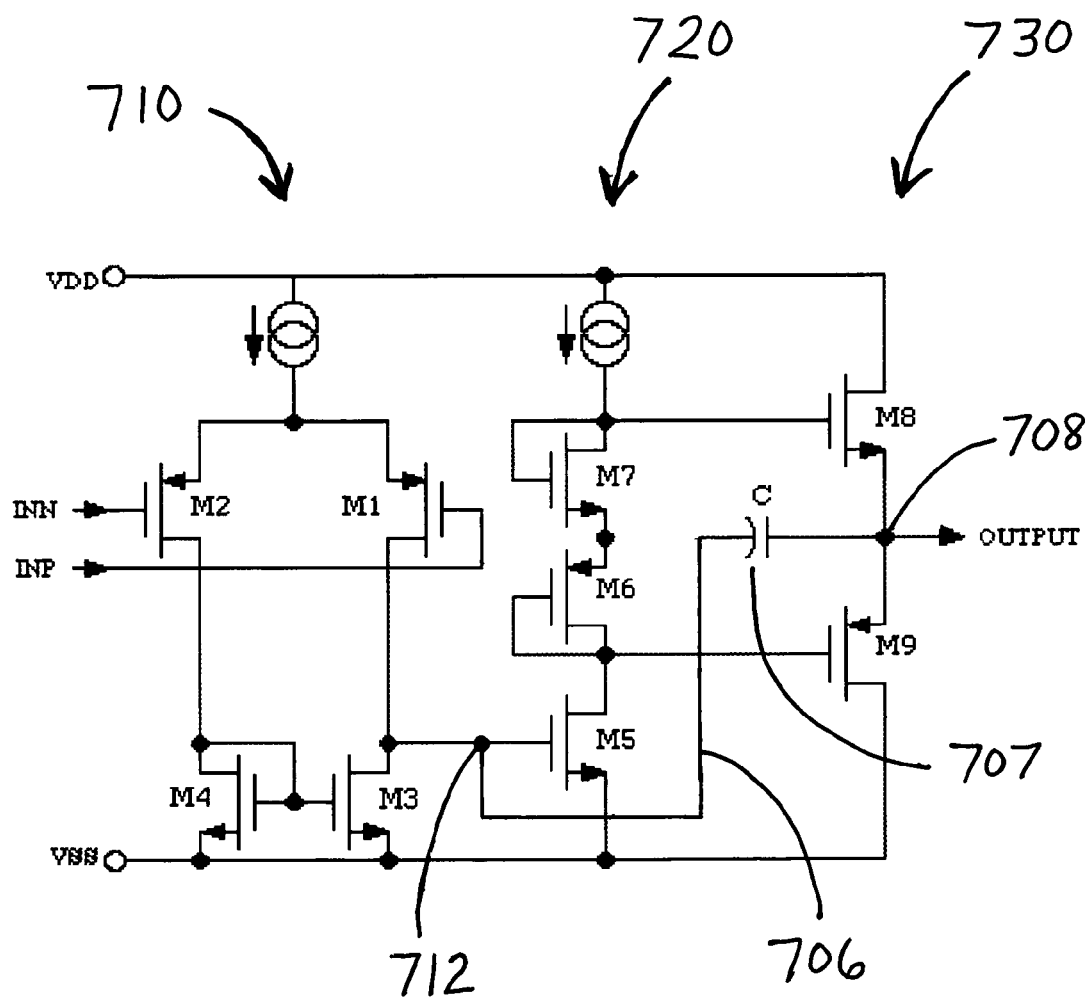
FIG. 7 is a prior art three-stage op-amp.

FIG. 7 is simplified schematic of a prior art three-stage op-amp 700 using a classic compensation method. The op-amp 700 comprises a first stage 710, and second stage 720 and a third stage 730. The first stage 710 is a differential input stage with a relatively low output impedance that looks almost like a current source to the input of the second stage 720. The second stage 720 is a relatively high voltage gain stage whose output voltage is on the order of one hundred times its input voltage. The third stage is 730 is a push-pull, unity gain stage. The op-amp of FIG. 7 has a feedback path 706 consisting of a compensation capacitor C 707 extending from the output node 708 of the third stage 730 to the input node 712 of the second stage 720. The operation of FIG. 7 is well known to persons skilled in the art.

Figure 8:
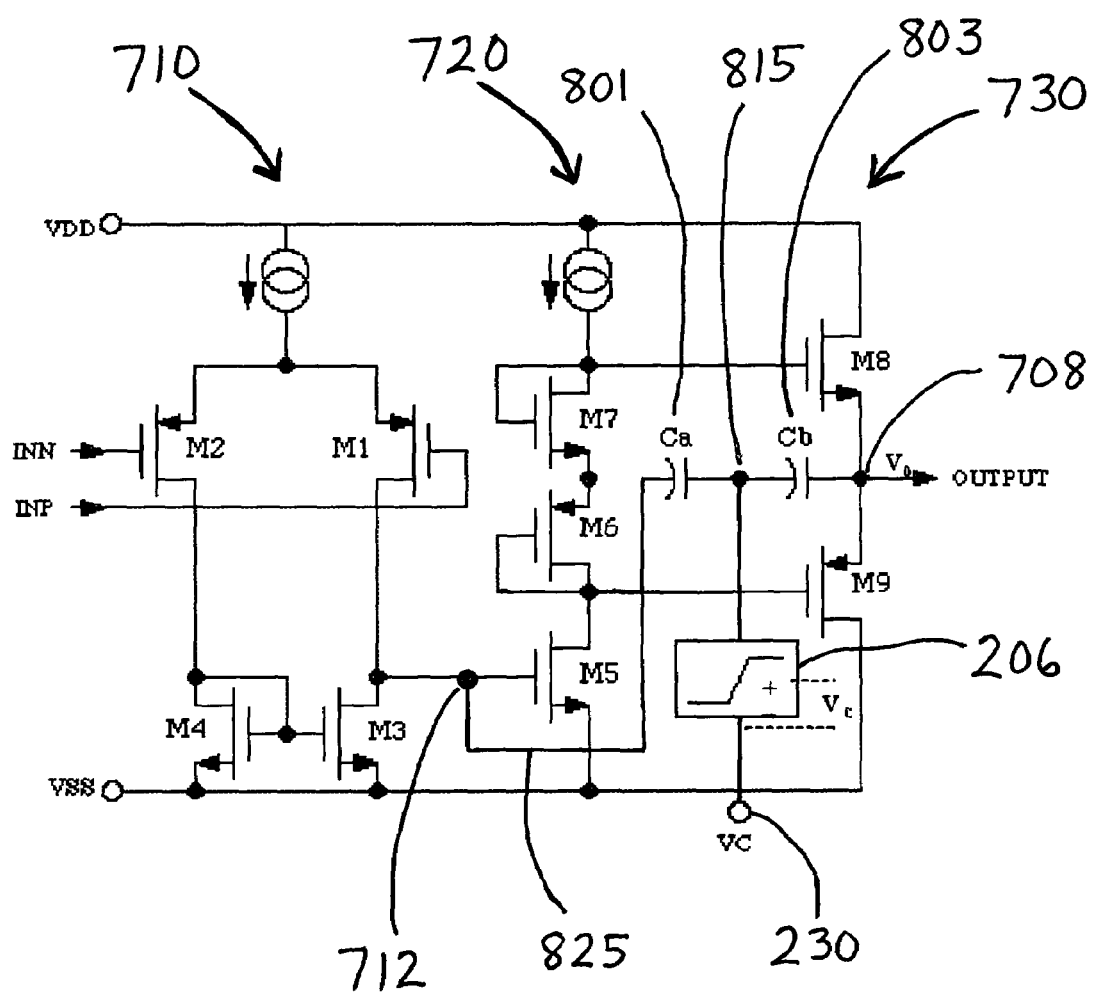
FIG. 8 is a three-stage op-amp in accordance with the invention.

FIG. 8 shows a simplified three-stage op-amp 800, showing the feedback path 706 of FIG. 7 replaced with a feedback path 825 in accordance with the invention. Circuit elements common to both FIG. 7 and FIG. 8 are numbered similarly. The op-amp 800 comprises a first stage 710, and second stage 720 and a third stage 730. The feedback path 825 comprises capacitor $C_A$ 801 capacitor $C_B$ 803, in series, extending from the output node 708 of the third stage 730 to the input node 712 of the second stage 720, with a common node AB 815 between them. The feedback path 825 also comprises the clamping circuit 206 connected between node AB 815 and ground 230. The clamping circuit 206 of FIG. 8 can be any of those from FIGS. 4, 5 and 6. The best choice would be FIG. 5 for a CMOS process. The fact that the third stage 703 of op-amp 800 does not produce a rail-to-rail output does not affect the operation of the invention. During large amplitude input signals, the compensation capacitance of the op-amp 800 does not provide feedback, thereby increasing slew rate.

Figure 9:
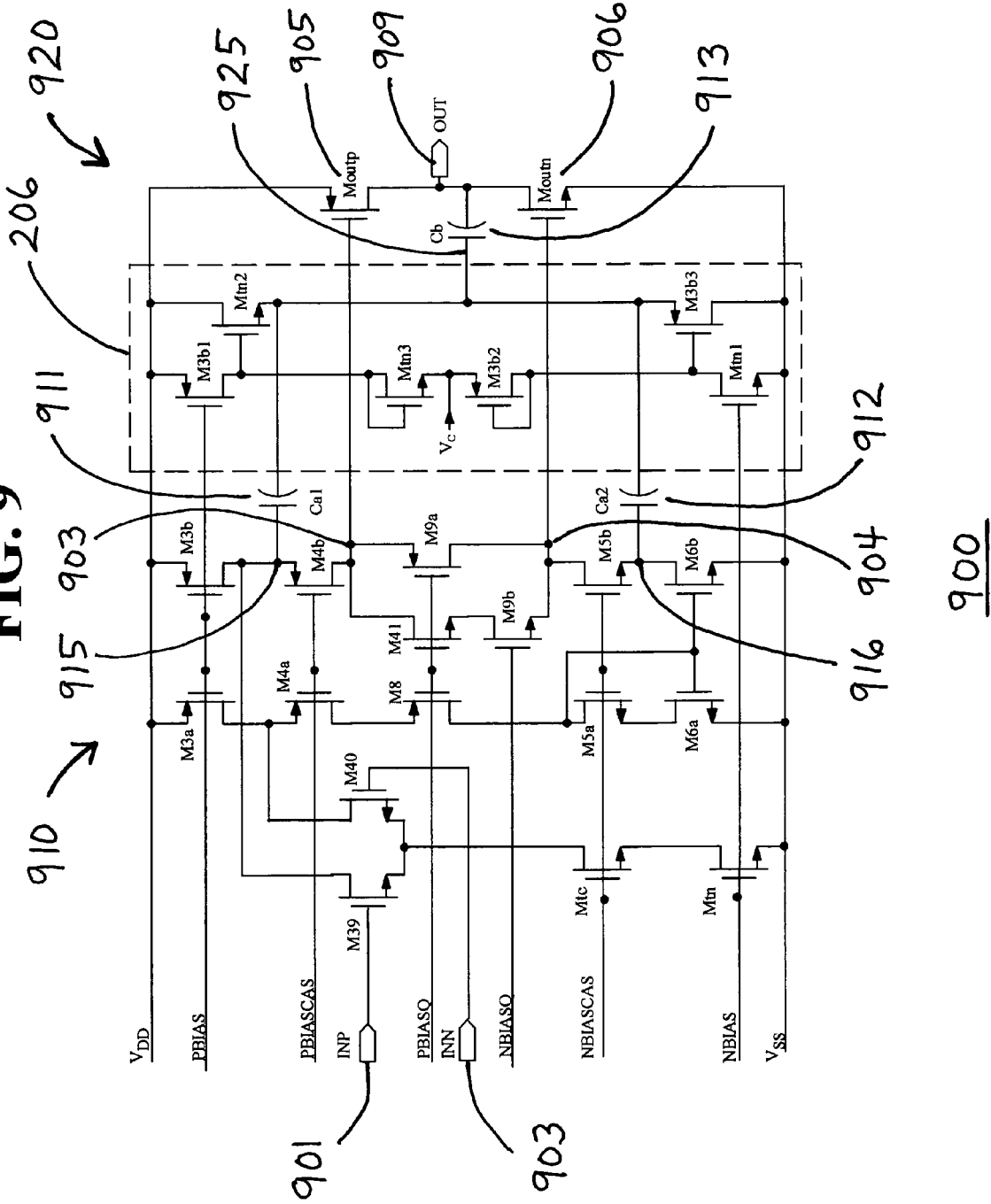
FIG. 9 is a more detailed two-stage, folded cascode op-amp with the clamping circuit of FIG. 5, in accordance with the invention.

FIG. 9 is a complete two-stage CMOS folded cascode op-amp 900 in accordance with the invention, having first stage 910 and a second stage 920. The first stage is a differential stage with two inputs INP 901 and INN 902. The first stage has two outputs to accommodate the symmetrical nature of the second stage. One output is at node 903 and the other output is at node 904.

The second stage 920 is a class B push-pull op-amp with DC biasing, comprising transistors Moutp 905 and Moutn 906. Accordingly, the second stage has two inputs. The inputs of the second stage are at the gates of transistors Moutp 905 and Moutn 906. The output 909 of the second stage 920 is at the drains of transistors Moutp 905 and Moutn 906, which are connected to a common node. The second stage 920 has a feedback path 925 in accordance with the invention, comprising compensation capacitors $C_B$ and $C_{A1,A2}$ and the clamping circuit 206. In the configuration of FIG. 9, employing the split compensation capacitor technique and clamping circuit 206 in accordance with the invention uses three capacitors. Capacitor $C_A$ now consists of two capacitors, $C_{A1}$ and $C_{A2}$. A prior art two-stage CMOS folded cascode op-amp (not shown) would require, because of the symmetrical design of the second stage, two compensation capacitors in parallel, one capacitor coupled between the output and one of the inputs of the second stage; and the other capacitor coupled between the output and the other of the inputs of the second stage.

In an alternative embodiment (not shown) of the invention, the feedback path 925 extends from the output of the second stage 920 to the outputs of the first stage 910 of the op-amp 900. In the alternative embodiment, the second stage 920 of op-amp 900 includes capacitor $C_B$ 913 coupled between the output 909 of the second stage and the clamping circuit 206; capacitor $C_{A1}$ 911 coupled between the clamping circuit 206 and node 903; and capacitor $C_{A2}$ 912 coupled between the clamping circuit 206 and node 904. Node 903 is, of course, both one of the outputs of the first stage 910 and one of the inputs of the second stage 920. Similarly, node 903 is both the other of the outputs of the first stage 910 and the other of the inputs of the second stage 920.

In the embodiment shown in FIG. 9, the feedback path 925 is not from the output of the second stage 920 to the outputs of the first stage 910 of the op-amp 900. Rather, the feedback path 925 is from the output of the second stage 920 to nodes 915 and 916 of the first stage 910. In the embodiment shown in FIG. 9, the second stage 920 of op-amp 900 includes capacitor $C_B$ 913 coupled between the output 909 of the second stage and the clamping circuit 206; capacitor $C_{A1}$ 911 coupled between the clamping circuit 206 and node 915; and capacitor $C_{A2}$ 912 coupled between the clamping circuit 206 and node 916. By coupling the feedback path to nodes 915 and 916 rather than to the outputs (at nodes 903 and 904) of the first stage, the capacitance of the feedback path 925 can be advantageously reduced by a factor of four. In accordance with the invention, capacitor $C_B$ is in series with the parallel combination of capacitors $C_{A1}$ and $C_{A2}$ in FIG. 9.

The feedback path 925, can advantageously increase the slew rate of a prior art two-stage CMOS folded cascode op-amp (not shown) having, for example, a single prior art compensation capacitor having a value of 0.4 pF. In such case, the values of the compensation capacitors in the feedback path in accordance with the invention, would be: 0.4 pF for $C_{A1}$ 911 and $C_{A2}$ 912, and 0.8 pF for $C_B$ 913. Preferably, for op-amp 900, $V_{DD}$=5 V, Positive Bias PBIAS=3.804 V, Positive Bias Cascode PBIASCAS=3.247 V, Input Positive INP=2.5 V, Positive Bias Quiescent PBIASQ=2.757 V, Input Negative INN=2.5 V, Negative Bias Quiescent NBIASQ=1.959 V, Negative Bias Cascode NBIASCAS=1.192 V, Negative Bias NBIAS=0.9035 V, and $V_{SS}$=17.65 μV.

Figure 10:
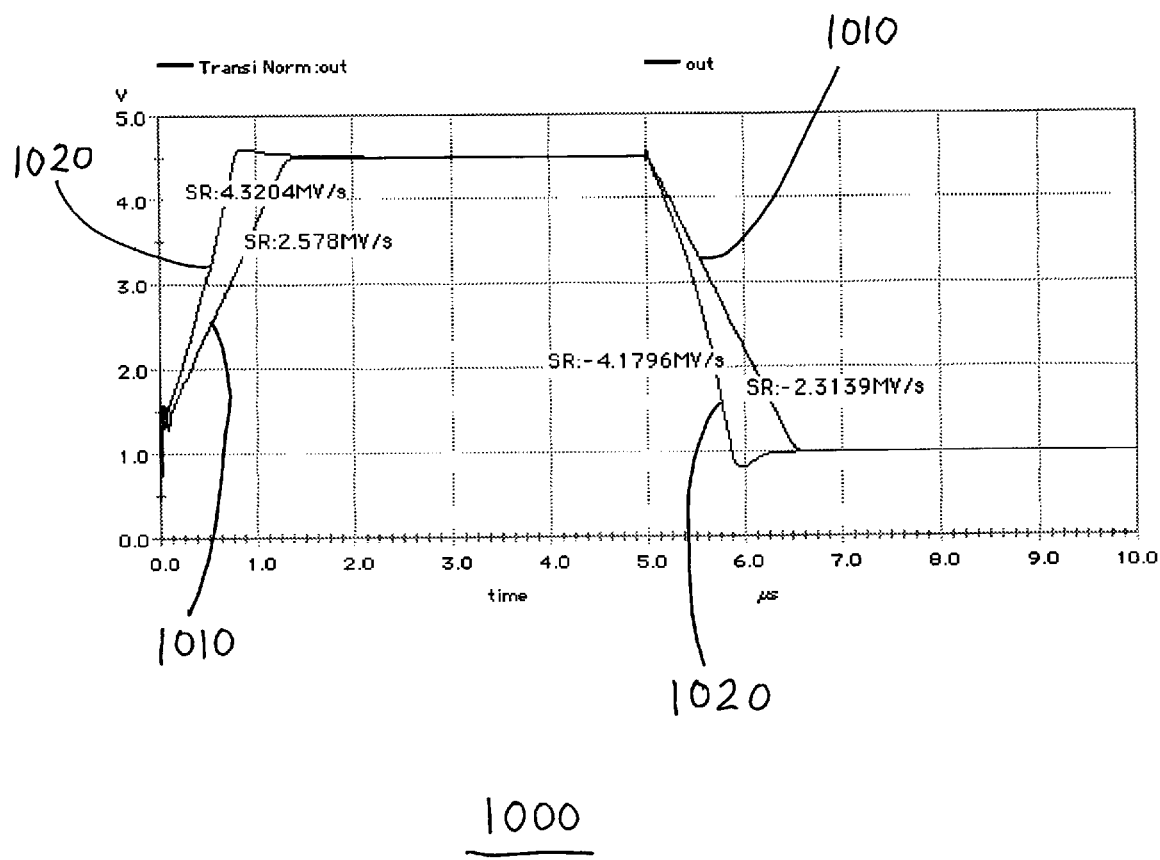
FIG. 10 is a graph of a slew rate response simulation for the op-amp shown in FIG. 9.

FIG. 10 is a graph of a slew rate response simulation 1000 of the op-amp 900 shown in FIG. 9. The prior art response 1010 is slower. The improved response 1020 in accordance with the invention is faster. As FIG. 10 shows, the split capacitor topology advantageously increases the slew rate to about 5 V/μs.

Figure 11:
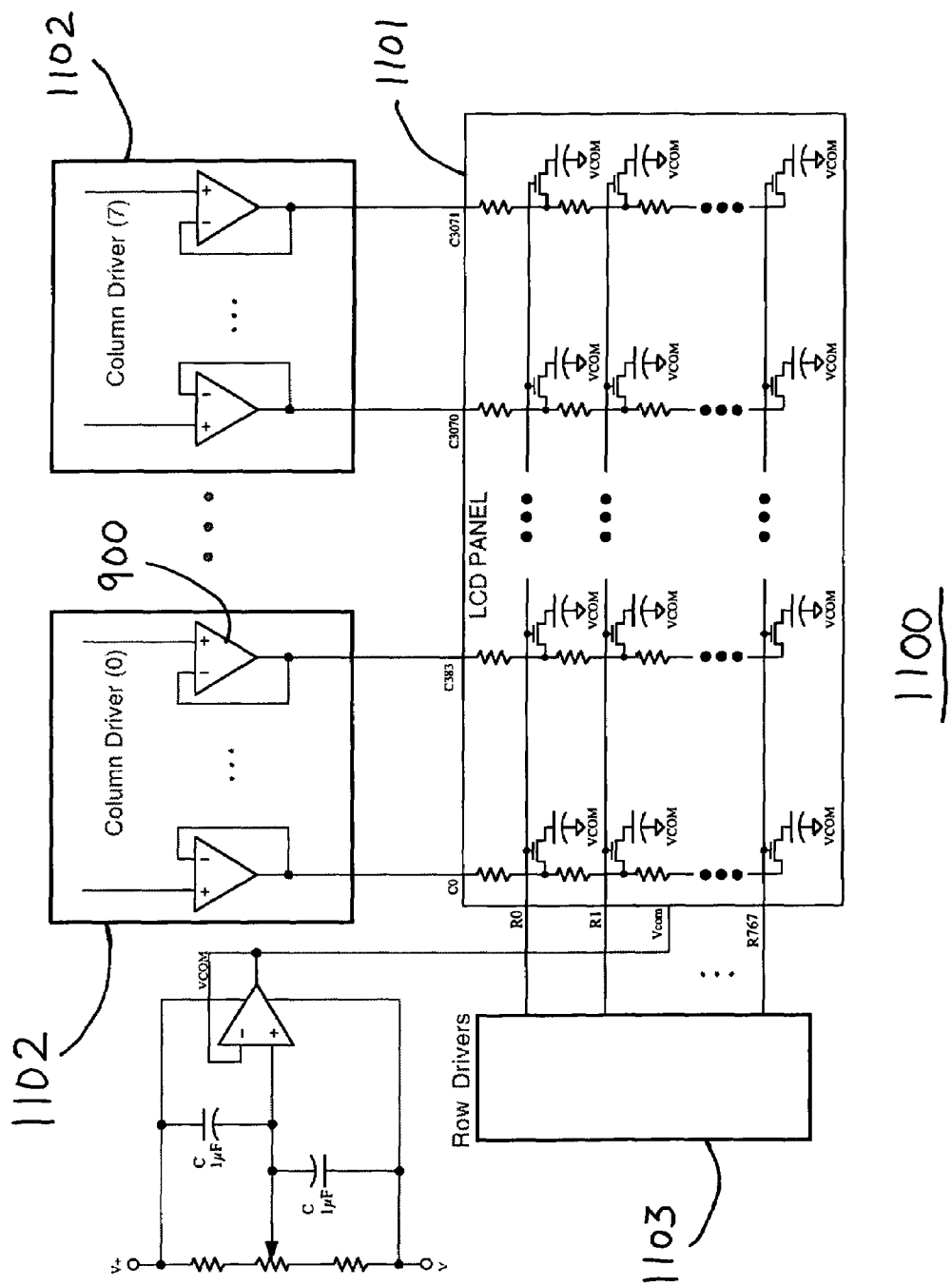
FIG. 11 is a functional block diagram of a portion of a LCD panel system that includes the op-amp of FIG. 9.

FIG. 11 is a simplified functional block diagram of a LCD panel system 1100 comprising a LCD panel 1101, and a plurality of column driver integrated circuits 1102. The LCD panel system 1100 has eight column driver integrated circuits 1102; however, for simplicity of illustration, only column driver integrated circuit (0) and column driver integrated circuit (7) are shown. Each column driver integrated circuit 1102 has a plurality of op-amps 900. The eight column driver integrated circuits 1102 are electrically coupled to the LCD panel 1101. The example LCD panel 1101 shown in FIG. 11 has a size of 768×1024 pixels, and therefore requires more than 2.3 million drivers. In the example LCD panel system 1100 shown in FIG. 11, each column driver integrated circuit 1102 has at least three hundred eighty-four (384) op-amps 900. The output of each op-amp 900 is electrically coupled to a source of each thin film transistor associated with a pixel of the LCD panel 1101. The LCD panel system 1100 also includes a plurality of row driver integrated circuits 1103, each having a plurality of row driver op-amps (not shown). The output of each row driver op-amp is electrically coupled to a gate of each thin film transistor associated with a pixel of the LCD panel 1101.

Because LCD panel drivers are used in battery-powered applications, the quiescent current needs to be kept as low as possible while still maintaining a high slew rate of about 5 V/µs. As many as one thousand thirty-two (1032) op-amps 900 are on one column driver integrated circuit 1102; therefore, it is important that any slew rate boosting circuitry, such as the slew rate enhancement circuit in accordance with the invention, be made from as few components as possible.

Another advantage of the split capacitor technique in accordance with the invention is that the maximum voltage across each of $C_A$ and $C_B$ can be half that of a classic compensation circuit by choosing $V_{CLAMP}=V_{DD}/2$ and $C_A=C_B$. An integrated circuit design technique known as voltage doubling uses a 5 V manufacturing process to manufacture a 10 V integrated circuit; however, such an integrated circuit is limited to having silicon dioxide capacitors with a breakdown voltage of only 5 V. Advantageously, a 10 V op-amp having the slew rate enhancement circuit of the invention can be manufactured using a 5 V integrated circuit manufacturing process, because the maximum voltage across each of $C_A$ and $C_B$ remains limited to 5V.

While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims. For example, the capacitances of $C_A$ and $C_B$ do not have to be equal. Also, the plate of $C_A$ at node AB does not need to be clamped to ground during large signal conditions, but could alternatively be floated, while only the plate of $C_B$ at node AB is clamped to ground during large signal conditions. The slew rate enhancement circuit of the invention is not limited to use with an op-amp, but can be used with any amplifier employing any type of compensation where one side of the compensation capacitor is connected to the output of a high current stage. The input stage does not need to be a differential pair. Any input stage with a high output impedance will work. Alternatively, three and four stage amplifiers use the enhancement circuit of the invention; although in such designs, the compensation is usually performed in the second or third stage.

We claim:

1. An amplifier having an output and an input, with a feedback path from the output to the input, the feedback path comprising:
   a common node;
   a first capacitor having a first end coupled to the amplifier input and a second end coupled to the common node;
   a second capacitor having a first end coupled to the common node and a second end coupled to the amplifier output; and
   a clamping circuit connected between the common node and an AC ground for clamping a voltage at the common node in response to a voltage at the amplifier output.

2. The amplifier of claim 1 in which the clamping circuit includes means to pre-select the output voltage at which the clamping circuit clamps.

3. The amplifier of claim 1 in which the first capacitor and the second capacitor are of substantially the same capacitance.

4. The amplifier of claim 3 in which the clamping circuit includes means to pre-select the output voltage at which the clamping circuit clamps.

5. The amplifier of claim 1 in which the first capacitor and the second capacitor are of substantially the same capacitance and in which the clamping circuit clamps the common node in response to a voltage at the amplifier output being greater than twice the voltage at the common node.

6. The amplifier of claim 5 in which the clamping circuit includes two diodes connected in an anti-parallel configuration, the two diodes extending from the common node to the AC ground.

7. The amplifier of claim 6 in which the AC ground is also a DC ground.

8. A slew rate boosted amplifier, comprising;
   a transconductance amplifier stage having at least one input and at least one output;
   a second amplifier stage having an output and at least one input, wherein the at least one output of the transconductance stage is coupled to the at least one input of the second stage; and
   a capacitance path electrically coupled from the output of the second stage to the input of the second stage, wherein the capacitance path includes:
   a common node;
   a first capacitor coupled between the output of the second stage and the common node; and
   a second capacitor coupled between the common node and the input of the second stage; and
   a clamping circuit electrically coupled between the common node and an AC ground.

9. The slew rate boosted amplifier of claim 8, in which the clamping circuit includes means to pre-select a voltage at which the clamping circuit clamps the common node to ground.

10. An amplifier having an input for receiving input signals, an output for outputting output signals and a feedback path from the input to the output, the feedback path comprising:
    a common node;
    a first capacitor coupled between the amplifier input and the common node;
    a second capacitor coupled between the common node and the amplifier output; and
    a clamping circuit for clamping a voltage at the common node in response to a voltage at the amplifier output, the impedance of the clamping circuit being high for small amplitude input signals and the impedance of the clamping circuit being small for large amplitude input signals.

11. The amplifier of claim 10 in which the clamping circuit includes means to preselect a voltage such that any voltage greater than the pre-selected voltage defines a large amplitude input signal.

* * * * *